United States Patent
Kong et al.

(10) Patent No.: US 11,060,186 B2
(45) Date of Patent: Jul. 13, 2021

(54) IN SITU GENERATION OF GASEOUS PRECURSORS FOR CHEMICAL VAPOR DEPOSITION OF A CHALCOGENIDE

(71) Applicant: Massachusetts Institute of Technology, Cambridge, MA (US)

(72) Inventors: Jing Kong, Winchester, MA (US); Qingqing Ji, Cambridge, MA (US); Zhenfei Gao, Beijing (CN)

(73) Assignee: Massachusetts Institute of Technology, Cambridge, MA (US)

( * ) Notice: Subject to any disclaimer, the term of this patent is extended or adjusted under 35 U.S.C. 154(b) by 126 days.

(21) Appl. No.: 16/382,407

(22) Filed: Apr. 12, 2019

(65) Prior Publication Data
US 2019/0338416 A1     Nov. 7, 2019

Related U.S. Application Data

(60) Provisional application No. 62/657,061, filed on Apr. 13, 2018.

(51) Int. Cl.
| | |
|---|---|
| *C23C 16/30* | (2006.01) |
| *C23C 16/08* | (2006.01) |
| *C23C 16/455* | (2006.01) |

(52) U.S. Cl.
CPC ............ *C23C 16/305* (2013.01); *C23C 16/08* (2013.01); *C23C 16/45512* (2013.01)

(58) Field of Classification Search
CPC .................................................. C23C 16/305
See application file for complete search history.

(56) References Cited

U.S. PATENT DOCUMENTS

| | | | |
|---|---|---|---|
| 9,637,839 B2 | 5/2017 | Kong et al. | |
| 9,840,764 B2 | 12/2017 | Chueh et al. | |
| 2001/0054377 A1* | 12/2001 | Lindfors | C23C 16/4402 117/104 |
| 2003/0157270 A1* | 8/2003 | Wang | C23C 8/36 427/569 |

(Continued)

OTHER PUBLICATIONS

Gao et al., "In Situ-Generated Volatile Precursor for CVD Growth of a Semimetallic 2D Dichalcogenide," ACS Appl. Mater. and Interfaces, vol. 10, pp. 34401-34408, Supplemental Information pp. S-1-S-7, Sep. 2018.

(Continued)

*Primary Examiner* — Joseph A Miller, Jr.
(74) *Attorney, Agent, or Firm* — Theresa Lober (57) ABSTRACT

In a method provided herein for forming a chalcogenide film on a substrate, an elemental solid is exposed to a hydrogen halide gas in a heated reaction environment at a temperature at which the hydrogen halide gas promotes the elemental solid to evolve into an elemental halide-based gas. The elemental halide-based gas is then exposed to a chalcogen gas provided in the heated reaction environment, at a temperature at which the elemental halide-based gas is reactive with the chalcogen gas to produce a solid chalcogenide reaction product. A substrate is provided in the heated reaction environment for deposition thereon of a solid film of the solid chalcogenide reaction product that results from exposure of the elemental halide-based gas to the chalcogen gas in the heated reaction environment.

19 Claims, 10 Drawing Sheets

(56) References Cited

U.S. PATENT DOCUMENTS

| | | | | |
|---|---|---|---|---|
| 2007/0227668 | A1* | 10/2007 | Iizuka | H01J 37/32082 156/345.48 |
| 2010/0236630 | A1* | 9/2010 | Kim | C23C 16/305 136/262 |
| 2013/0299047 | A1* | 11/2013 | Fabijanic | C23C 8/24 148/230 |
| 2016/0372365 | A1* | 12/2016 | Tang | H01L 21/02186 |

OTHER PUBLICATIONS

Zhou et al., "A library of atomically thin metal chalcogenides," Nature, vol. 556, pp. 355-359 and Methods pp. 1-2, Apr. 2018.

Ji, "Exploring synthetic 2D transition metal dichalcogenides and their derivatives," PSU Graphene and Beyond Workshop, State College, PA, slides 1-31, May 9, 2018.

* cited by examiner

IN SITU GENERATION OF GASEOUS PRECURSORS FOR CHEMICAL VAPOR DEPOSITION OF A CHALCOGENIDE

CROSS-REFERENCE TO RELATED APPLICATION

This application claims the benefit of U.S. Provisional Patent Application No. 62/657,061, filed Apr. 13, 2018, the entirety of which is hereby incorporated by reference.

STATEMENT REGARDING FEDERALLY SPONSORED RESEARCH

This invention was made with Government support under Grant Nos. ECCS0939514 and DMR1231319 awarded by the National Science Foundation (NSF). The Government has certain rights in this invention.

BACKGROUND

This invention relates generally to vapor deposition processes, and more particularly relates to vapor deposition processes to form a chalcogenide film.

Two-dimensional (2D) transition metal dichalcogenides (TMDs) represent a large family of materials that span a wide spectrum of electronic properties, including metals, semimetals, semiconductors, and superconductors, and generally including one or more of the chalcogens, sulfur (S), selenium (Se), and tellurium (Te). Semiconducting TMDs, such as $MoS_2$ and $WSe_2$, have been proven to be good candidates for high-performance electronics and optoelectronics in the post-silicon era, and provide supreme flexibility. Semiconducting TMDs can also serve as a host for manipulating spin and valley degrees of freedom to enable new device paradigms such as spintronics and valleytronics.

As for metallic and semimetallic TMDs, the constituent metal elements generally come from Group IVB and Group VB in the periodic table, namely, titanium (Ti), vanadium (V), Niobium (Nb) and tantalum (Ta). A wealth of physics such as magnetism, charge density waves, and superconductivity have been revealed in these materials and recently have attracted enormous research interest in the dimensionality effects of these intriguing properties. In particular, Ti-based semimetallic TMDs, such as $TiSe_2$, which has a layered structure, have been established as an essential research platform for Bose condensation, a macroscopic quantum phenomenon closely related to superfluidity and superconductivity. Such electrically conductive 2D materials can enable lateral micro-integration with semiconducting TMDs in the 2D plane to produce all-$MX_2$-based (M: transition metals; X: chalcogen elements) 2D microelectronics having planar integrity.

To enable the realization of these microelectronic TMD systems and devices as well as other chalcogenide-based systems and devices, nanoscale control of chalcogenide material formation and the resulting chalcogenide structure is essential for implementation of chalcogenide-based microfabrication processes. But currently, significant challenges imposed by the inherent characteristics of chalcogenide synthesis prohibit the production of these materials in batch quantities and with the high electronic quality that is required to meet the demands of commercial applications.

For example, many metal elements to be included in the formation of semimetallic or metallic chalcogenide materials have relatively high melting points, and therefore cannot be processed under conventional low-temperature synthesis conditions to produce films or layers of the materials within reasonable processing durations. Conventionally, bulk TMD crystals are prepared by chemical vapor transport (CVT) techniques, which are not only time-consuming, typically requiring process durations of tens of hours, but which also generally require complicated processes that provide only indirect access to corresponding 2D crystals. In one example CVT process attempting to overcome such limitations, specifically in an effort to synthesize 2D $TiSe_2$ nanosheets, a relatively less-active transport agent, e.g., AgCl, is employed together with a much-reduced growth duration of several minutes. This CVT method, while having some advantages, is severely limited by excessive process complexity involving vacuum ampule sealing and a requirement to remove the residue of transport agents that contaminate crystal surfaces.

Chemical vapor deposition (CVD) has been recognized as an effective way to synthesize 2D nanosheets of Group-VIB metal dichalcogenides. In general, such CVD synthesis processes involve the reaction of volatile $MoO_3$ or $WO_3$ with chalcogen vapors and provides several advantages over CVT techniques. But this CVD chalcogenide synthesis cannot be extrapolated directly other groups, such as to the growth of Group-IVB and Group-VB TMDs, because the corresponding metal oxides are generally nonvolatile. The melting points of $TiO_2$ and $Ta_2O_5$ are 1843° C. and 1872° C., respectively. These metal oxides cannot therefore be introduced into a CVD process in the gas phase, which is required for the vapor deposition paradigm of the process. To address this limitation, it has been suggested to employ a volatile metal chloride precursor for such a CVD process, e.g., for the CVD growth of 2D $VS_2$ and $TaS_2$ nanosheets. But these metal chlorides hydrolyze easily in ambient conditions, introducing oxygen that is inevitably incorporated into the depositing TMD material, thereby destroying the material properties associated with pristine $MX_2$.

This limitation extends in general to CVD processes in which a gaseous metal halide is a required precursor. Efforts to achieve high-purity, high-quality material vapor deposition with the convenience, low cost, and short process duration conventionally associated with CVD processes remain unsuccessful due to the limitations posed by the use of the metal halides themselves. The lack of facile and controllable synthetic production methods requiring a gaseous metal halide precursor has impacted a wide range of applications; many important and interesting microelectronic devices and systems requiring large-area chalcogenide-based materials, cannot be produced and exploited for intended applications.

SUMMARY

In a method provided herein for forming a chalcogenide film on a substrate, an elemental solid is exposed to a hydrogen halide gas in a heated reaction environment at a temperature at which the hydrogen halide gas promotes the elemental solid to evolve into an elemental halide-based gas. The elemental halide-based gas is then exposed to a chalcogen gas provided in the heated reaction environment, at a temperature at which the elemental halide-based gas is reactive with the chalcogen gas to produce a solid chalcogenide reaction product. A substrate is provided in the heated reaction environment for deposition thereon of a solid film of the solid chalcogenide reaction product that results from exposure of the elemental halide-based gas to the chalcogen gas in the heated reaction environment.

In a further method provided herein for forming a chalcogenide film on a substrate, a hydrogen halide gas is formed by heating an ammonium halide solid in a heated reaction environment at a temperature that causes the ammonium halide solid to decompose into the hydrogen halide gas. An elemental solid is exposed to the hydrogen halide gas in the heated reaction environment at a temperature at which the hydrogen halide gas promotes the elemental solid to evolve into an elemental halide-based gas. A chalcogen gas is formed by heating a chalcogen solid in the heated reaction environment at a temperature that causes the chalcogen solid to evaporate into the chalcogen gas. The elemental halide-based gas is exposed to the chalcogen gas in the heated reaction environment, at a temperature at which the elemental halide-based gas is reactive with the chalcogen gas to produce a solid chalcogenide reaction product. A substrate is provided in the heated reaction environment for deposition thereon of a solid film of the solid chalcogenide reaction product that results from exposure of the elemental halide-based gas to the chalcogen gas in the heated reaction environment.

In a further method provided herein for forming a chalcogenide film on a substrate, there is disposed, in a heated reaction environment, an ammonium halide solid, a chalcogen solid, an elemental solid, and a substrate. Hydrogen halide gas is formed in the heated reaction environment by heating the ammonium halide solid in the heated reaction environment at a temperature that causes the ammonium halide solid to decompose into the hydrogen halide gas. The elemental solid is exposed to the hydrogen halide gas in the heated reaction environment at a temperature at which the hydrogen halide gas promotes the elemental solid to evolve into an elemental halide-based gas. A chalcogen gas is formed in the heated reaction environment by heating the chalcogen solid in the heated reaction environment at a temperature that causes the chalcogen solid to evaporate into the chalcogen gas. The elemental halide-based gas is exposed to the chalcogen gas in the heated reaction environment at a temperature at which the elemental halide-based gas is reactive with the chalcogen gas to produce a solid chalcogenide reaction product that can deposit on the substrate in the heated reaction environment.

With these methods, there is provided herein a technique that enables direct access, from solid starting materials, to a wide range of chalcogenide material layers of high crystallinity, provides superior growth morphology control over domain size, shape, and thickness, and provides superior process repeatability, all with the convenience of conventional CVD environments. The in situ generation of volatile reagents and precursors overcomes the limitations inherent to the materials addressed by the methodology without causing degradation in the resulting crystal quality. As a result, the methodology provided herein enables a superior paradigm for the production of 2D atomic crystals and their heterostructures, thereby addressing a wide range of advanced, planar microelectronic applications.

Other features and advantages of the methods provided herein will be apparent from the following description and accompanying drawings, and from the claims.

DETAILED DESCRIPTION

Herein are provided chemical vapor deposition (CVD) methods that enable precisely controlled and reproducible formation of material layers including high-melting-point elements, under conditions that are amenable to conventional microfabrication batch processing requirements. Referring to FIGS. 1A-1D and FIG. 2, in one embodiment, in a first step of the method 25, there is arranged a heated reaction environment 10 such as a microfabrication furnace tube, in which the method is conducted under ambient pressure and fully in situ. The reaction environment 10 is configured with any suitable thermal profile, e.g., with one or more different heating zones, in the manner described in detail below. The reaction environment is also configured, in the conventional manner, with provisions for gas flow 12 there through. A substrate 20, e.g., a microfabrication substrate, is disposed in the reaction environment for production of one or more layers of material thereon.

Figure 1A:
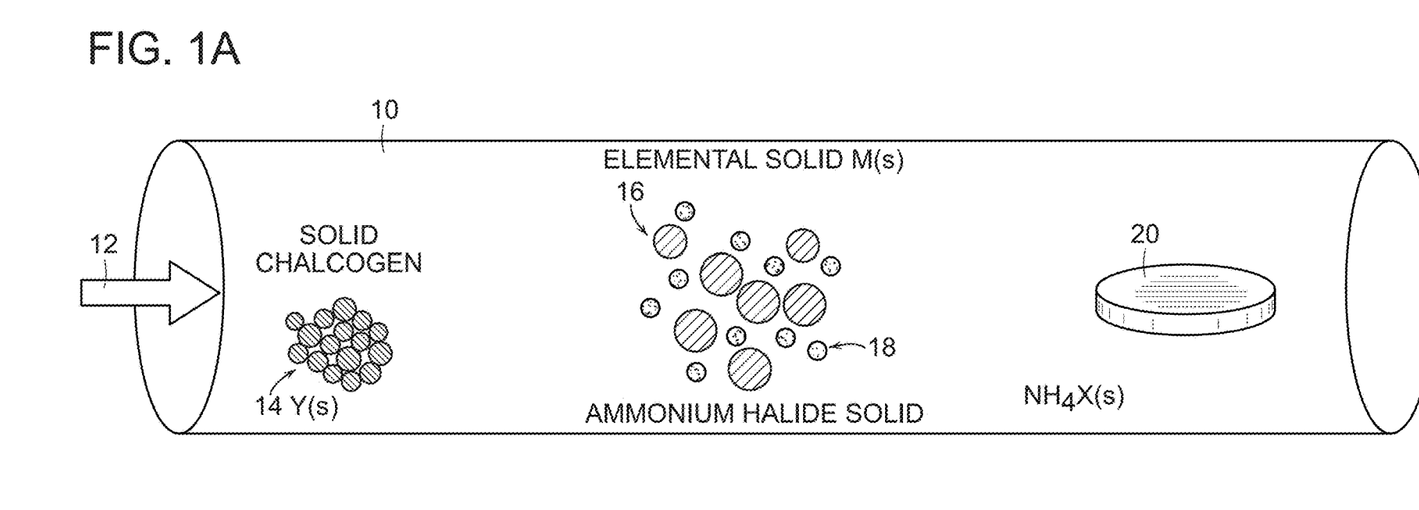
FIGS. 1A-1D are schematic views of a heated reaction environment in which is disposed a solid chalcogen, an elemental solid, an ammonium halide solid, and a substrate at the commencement of the CVD process provided herein, at two intermediate stages of the process, and in the final deposition step of the process, respectively.

Referring to FIG. 1A, in one embodiment, for producing on the substrate 20 one or more material layers including a chalcogen element, there is disposed within the heated reaction environment 10 a chalcogen element, e.g., S, Se, or Te, in solid form, as a solid chalcogen 14, Y(s), wherein Y is a chalcogen. The solid chalcogen 14 can be provided in any suitable form, e.g., as particles, particulates, grains, granules, powder, or other forms, preferably of small discrete mass. There is also disposed within the heated reaction environment 10 an elemental material solid 16, M(s), that includes one or more elements to react with the selected chalcogen 14. The elemental material solid 16 is characterized by reactivity with a hydrogen halide. Example suitable elemental solids 16, include Si, Ge, Sn, Pb, As, Sb, Bi, Ti, Zr, Hf, V, Nb, Ta, Mn, Re, Fe, Co, Ni, and other suitable elements, including metals, such as transition metals. In an alternative embodiment, an elemental solid oxide, that is, an oxide of an elemental solid, is instead employed, so long as the elemental oxide is reactive with a hydrogen halide. The elemental solid 16 is provided in powder form or other form, such as particles, particulates, grains, granules, or other form, such as one or more foil pieces, preferably of small discrete mass and preferably providing a large specific area compared to bulk form. There is further disposed in the heated reaction environment 10 an ammonium halide solid 18, $NH_4X(s)$, where X is a halogen, such as fluorine (F), chlorine (Cl), bromine (Br) or iodine (I).

Figure 1B:
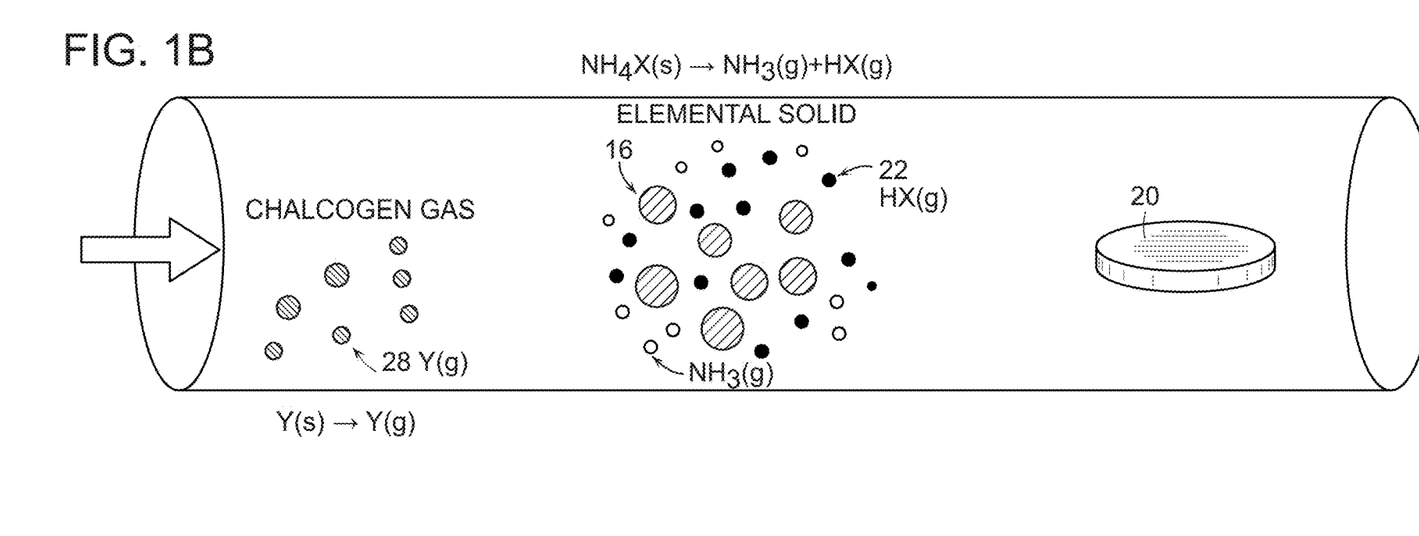
Figure 1C:
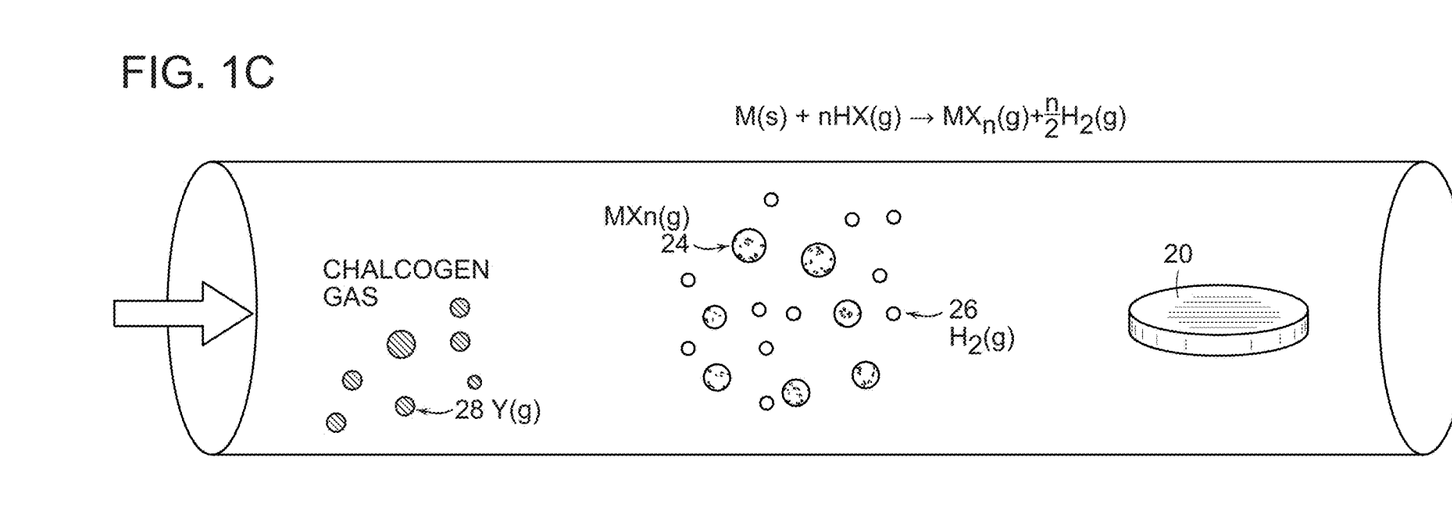
Figure 2:
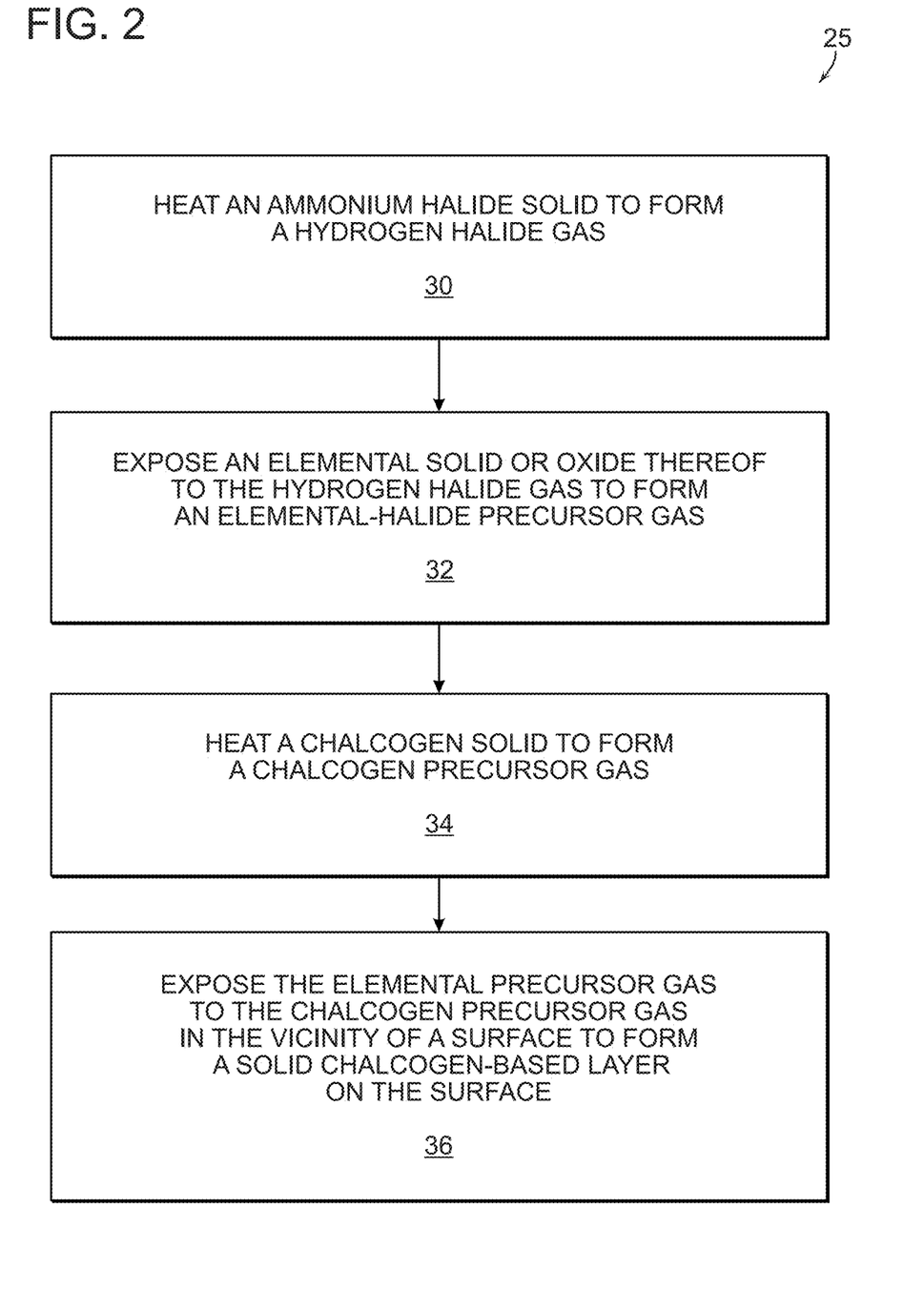
FIG. 2 is a flow diagram of the steps in the CVD process depicted in FIGS. 1A-1D.

In the CVD method 25, as shown in FIG. 2, in a first step 30, as shown in FIG. 1B, the ammonium halide solid 18, $NH_4X(s)$, is heated to a temperature that causes the formation of a hydrogen halide gas 22, HX(g), such as HCl(g), HF(g), HBr(g), or HI(g). This step also forms gaseous ammonia $NH_3(g)$. In a next step 32, shown in FIG. 1C, the elemental solid 16, M(s), is exposed to the hydrogen halide gas 22, HX(g), to cause evaporation of the elemental solid and thereby to form an elemental halide-based precursor gas 24, $MX_n(g)$, and to form hydrogen gas 26, $H_2(g)$. The term "elemental halide-based precursor gas" here refers to a precursor gas including components from the elemental solid and from the ammonium halide solid. In a further step 34, also shown in FIGS. 1B and 1C, the solid chalcogen 14, Y(s), is heated to a temperature that causes evaporation of the solid chalcogen 14, thereby to form a chalcogen precursor gas 28, Y(g).

Figure 1D:
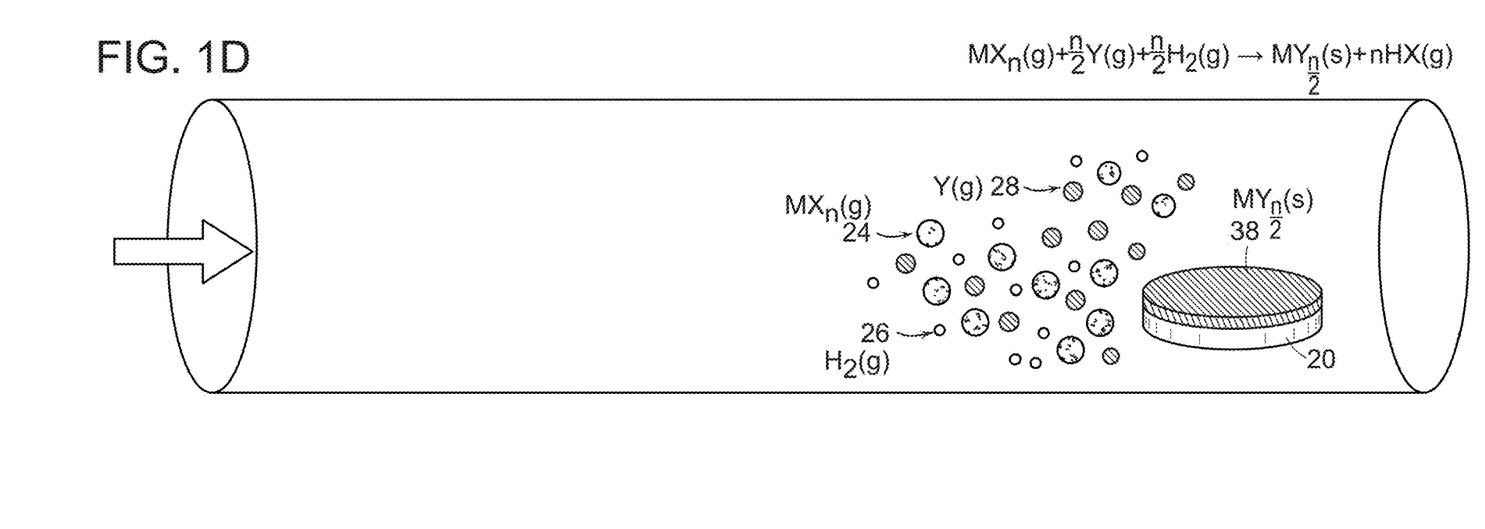

In a final step 36, shown in FIG. 1D, the elemental halide-based precursor gas 24, $MX_n(g)$, is exposed to the chalcogen precursor gas 28, Y(g), and the hydrogen gas 26, $H_2(g)$, in the vicinity of a substrate 20, by virtue of the flow of carrier gas 12 through the heated environment 10 toward the substrate. This precursor gas mixing leads to a reaction between the two gaseous precursors and deposition of the precursor reaction product on the surface of the substrate 20 to form a solid layer 38 of chalcogenide-based material, $MY_{n/2}(s)$, on the surface of the substrate 20, while also forming a gaseous hydrogen halide, HX(g).

The reactions occurring in this method can be summarized as follows:

$$NH_4X(s) \rightarrow NH_3(g) + HX(g) \quad (1)$$

$$M(s) + nHX(g) \rightarrow MX_n(g) + n/2 H_2(g) \quad (2)$$

$$\text{or } MO_{n/2}(S) + nHX(g) \rightarrow MX_n(g) + n/2 H_2O(g) \quad (3)$$

$$Y(s) \rightarrow Y(g) \quad (4)$$

$$MX_n(g) + n/2 Y(g) + n/2 H_2(g) \rightarrow MY_{n/2}(s) + nHX(g), \quad (5)$$

where X is a halogen such as F, Cl, Br, or I; M is an elemental solid such as Si, Ge, Sn, Pb, As, Sb, Bi, Ti, Zr, Hf, V, Nb, Ta, Mn, Re, Fe, Co, or Ni; $MO_{n/2}$ is an oxide of an elemental solid; and Y is a chalcogen such as S, Se, or Te.

With this method, a gaseous elemental halide-based CVD precursor and a gaseous chalcogenide precursor are each formed in situ, in the heated reaction environment that functions as a CVD deposition chamber in which the two precursors react. As is made clear from the reaction Expressions (1)-(5) above, hydrogen halide gas, HX(g), acts as an assistive reagent to promote evaporation of an elemental solid, M(s), in the formation of the gaseous elemental halide-based precursor, $MX_n(g)$. The hydrogen halide gas, HX(g), can itself be produced in situ by decomposition of an ammonium halide solid into the hydrogen halide gas and ammonia gas. A chalcogen gas precursor, Y(g), can also be formed in situ by evaporation from a solid chalcogen, Y(s). Thus, in one embodiment, all species involved in the CVD production of a material layer on a substrate are disposed in solid form in the heated CVD reaction environment. This in situ precursor gas production from solid elemental materials, such as high-melting-point materials, enables CVD processing with elements that are not amenable to conventional CVD conditions. By enabling CVD reactions with such materials, a wide range of low-dimensional inorganic nanomaterials and films can be controllably and accurately produced in a CVD environment.

Considering now further specifics of embodiments of the CVD methods provided herein, in one embodiment, the elemental solid is a metal solid powder, such as a powder of titanium, zirconium, hafnium, vanadium, niobium, tantalum, gallium, indium, tin, or other suitable metal powder. These metals are characterized by an ability to form stable layered structures of chalcogenides that crystallize into van der Waals solids. But the method is not limited to materials having this characteristic. Alternatively, metals having negative standard electrode potentials, such as iron and zinc, and other species, such as volatile chloride compounds and stable chalcogenide phases, can also be employed, even though the resulting chalcogenide material is not layered.

The hydrogen halide gas that is employed in the CVD process as an assistive reagent for enabling evaporation of the solid element, such as a solid metal, is in preferred embodiments produced from a solid ammonium halide such as $NH_4F$, $NH_4Cl$, $NH_4Br$, and $NH_4I$. But in general, the gaseous assistive reagent can be produced from any solid chemical that releases hydrogen halide gas during decomposition of the solid chemical. Thus, polyvinyl chloride and other such materials are suitable for providing an assistive reagent in the CVD method. Like the elemental solid, the solid ammonium halide can be provided in powder form, and in preferred embodiments, the elemental solid powder and the ammonium halide powder are provided in a powder mixture of the two.

Finally, the chalcogen precursor employed in the CVD process is selected to produce a corresponding sulfide, selenide, or telluride material layer by reaction with the elemental halide-based precursor gas. The only significant difference between the three chalcogens is their evaporation temperature (sulfur ~200° C., selenium ~300° C., tellurium ~450° C.), and therefore no particular CVD condition is required for a selected one of these chalcogens.

The heated reaction environment 10 shown in FIGS. 1A-1D can be configured in any suitable manner, e.g., with multiple different heating zones within the reaction environment. A different reaction zone temperature can be controllably imposed at each in a plurality of sites along the reaction environment to enable a selected CVD process. For example, the heated reaction environment can be partitioned into a series of separate thermal zones that are each tailored for evaporation of a specific species and/or for reaction of precursor species. Referring to the reaction Expressions (1)-(5) above, each of the reactions embodied therein can be conducted at a different site within the heated reaction environment, with the temperature of each site controlled individually.

A carrier gas supplied through the reaction environment can then be employed to co-mingle precursor gases for production of a material layer on a substrate that is positioned at a site in the reaction environment. Any suitable substrate material composition, substrate geometry, and substrate size can be employed. Mica substrates and other suitable substrates, such as surface-oxidized Si and sapphire (0001) can be employed.

In one embodiment, the CVD method of FIG. 2 is implemented for formation of a chalcogenide material layer that is a dichalcogenide, a trichalcogenide, a quadrachalcogenide, a quintachalcogenide, or other chalcogenide. In one example of such, a metal dichalcogenide, $TiS_2$, is produced by the CVD method provided herein to provide large-area, highly crystalline 2D $TiS_2$ nanosheets. In this CVD method, the reaction Expressions (1)-(5) above are implemented as follows:

$$NH_4Cl(s) \rightarrow NH_3(g) + HCl(g) \qquad (6)$$

$$2Ti(s) + 2xHCl(g) \rightarrow 2TiCl_x(g) + xH_2(g) \qquad (7)$$

$$S(s) \rightarrow S(g) \qquad (8)$$

$$2TiCl_x(g) + xH_2(g) + 4S(g) \rightarrow 2TiS_2(s) + 2xHCl(g), \qquad (9)$$

whereby the following reaction is achieved in situ:

$$Ti(s) + 2S(s) \rightarrow TiS_2(s). \qquad (10)$$

Figure 3:
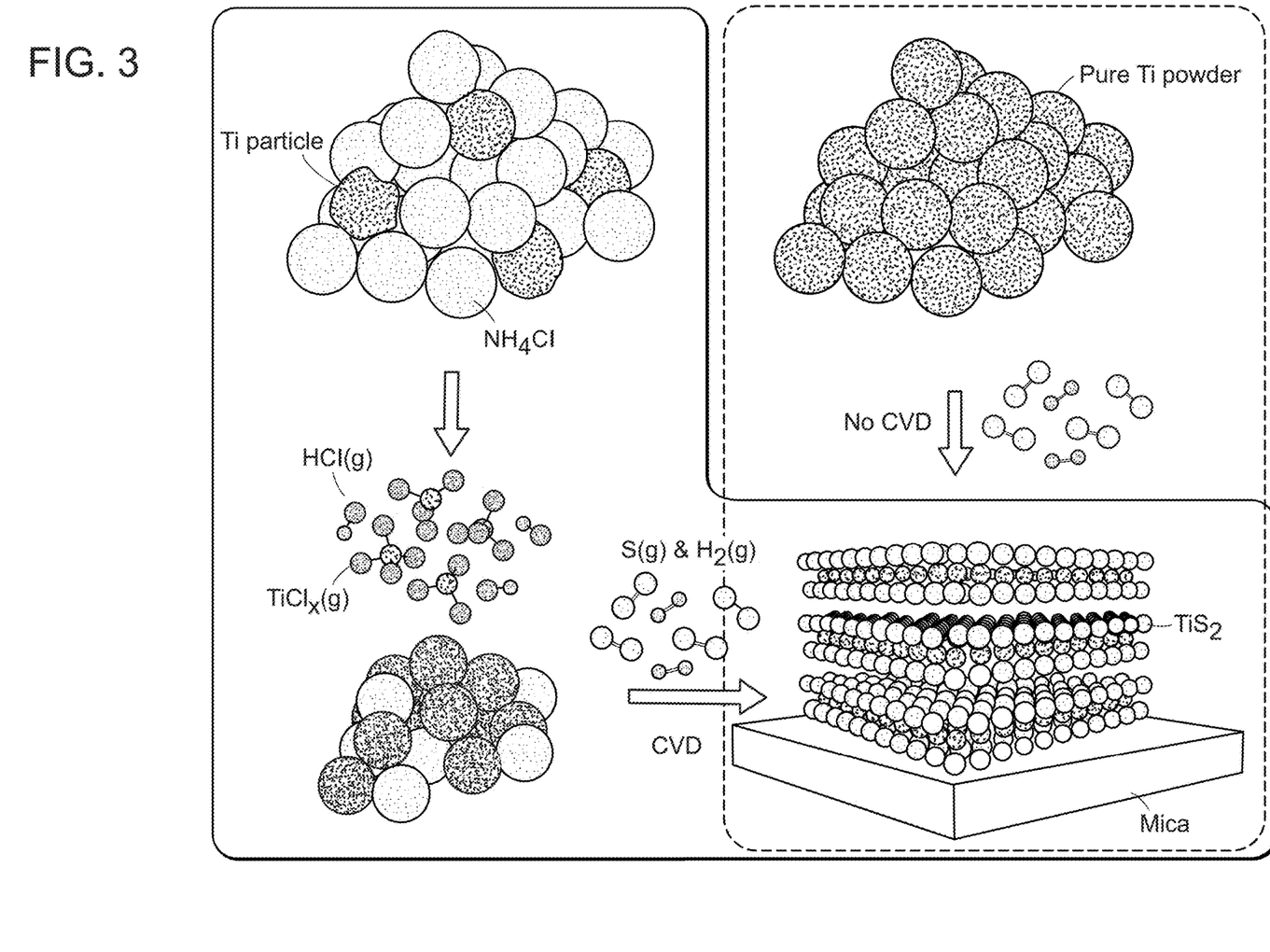
FIG. 3 is a schematic depiction of the reactions enabled by the CVD process of the flow diagram of FIG. 2.
Figure 4A:
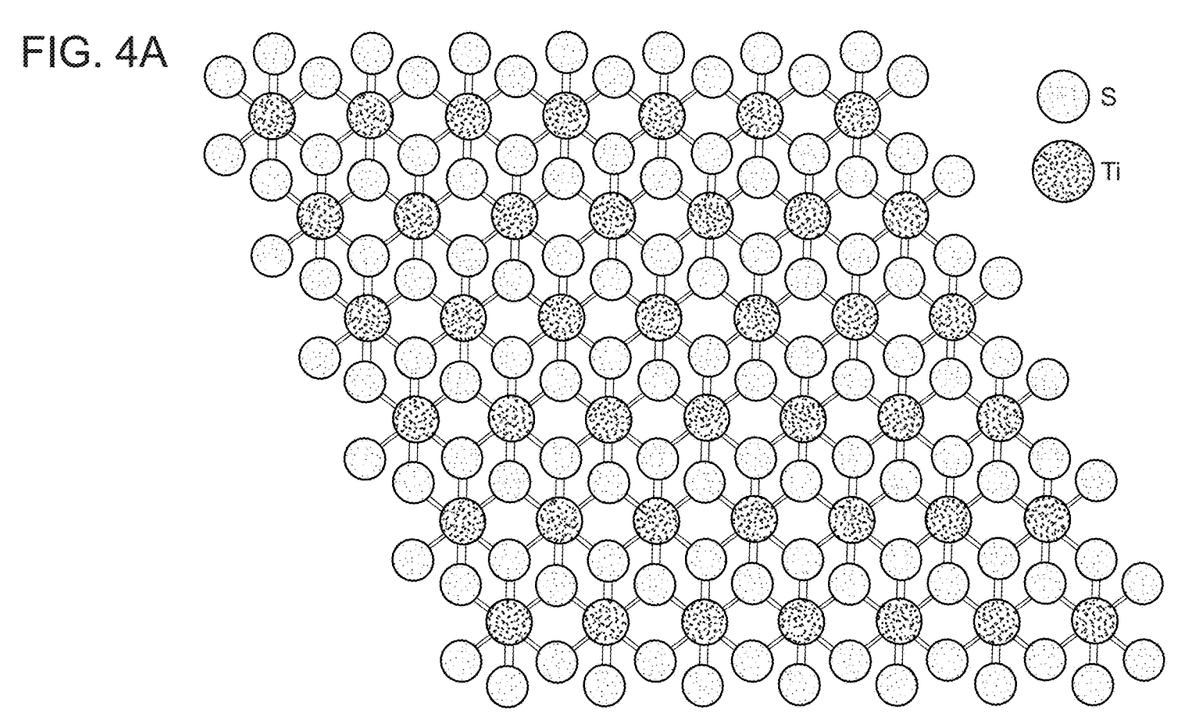
FIGS. 4A-4B are a planar view and a side view, respectively, of the structure of 1T-TiS$_2$ produced by the reactions of FIG. 3 and CVD process of the flow diagram of FIG. 2.
Figure 4B:
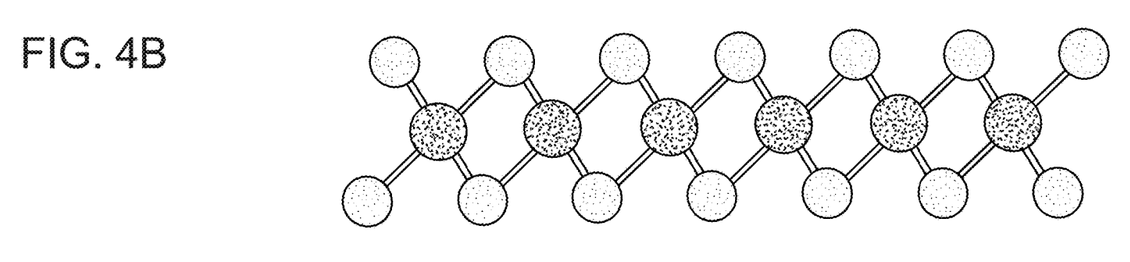

FIG. 3 illustrates these reactions and depicts the layered structure that is characteristic of a $TiS_2$ film produced by the reactions, here shown to be produced on a mica substrate. In this process, elemental powder is provided as elemental titanium (Ti) powder and ammonium chloride ($NH_4Cl$) powder, are disposed locally as a powder mixture, to enable HCl gas, produced by decomposition of the ammonium chloride, to promote evaporation of the high-melting-point Ti particles and form the gaseous metal halide $TiCl_x(g)$. It is discovered herein that ammonium chloride is particularly effective as an assistive reagent in the evaporation of Ti powder at a relatively moderate temperature. With the formation of sulfur gas, S(g), and hydrogen gas, $H_2(g)$, by the reactions of Expressions (7)-(8) above, there is enabled a reaction between the gaseous metal halide and gaseous sulfur and deposition of the reaction product, $TiS_2$, as shown in FIG. 3. FIG. 4A is a schematic top view of the 1T atomic structure of the produced $TiS_2$ material and FIG. 4B is a schematic side view of the 1T atomic structure. For each Ti atom, six sulfur atoms enclose the Ti atom and form a honeycomb matrix.

The combination of the reactions of Expressions (6)-(9) thereby are effectively a reaction of Ti and S to form $TiS_2$, as given in Expression (10). As a comparison, as shown in FIG. 3, no formation of $TiS_2$ on the mica substrate is observed if solid Ti powder is exposed to sulfur vapor. Without the in situ phase transitions enabled by the methods provided herein, the Ti powder does not evaporate and react with sulfur in the gas phase. Hence the $NH_4Cl$ transforms a solid-phase sulfurization reaction into a CVD process, which provides nanoscale controllability in the thickness and morphology of synthesized $TiS_2$ films. Further, it is discovered herein that $NH_4Cl$ decomposes completely into $NH_3$ and HCl, in Expression (6) above, producing no condensed solid on the surface of the substrate. Clean, precisely-formed monolayer and few-layer sheets of $TiS_2$ and other such materials can thereby be successfully produced with the shape, size, and thickness of the sheet finely adjusted by tuning the CVD conditions.

It is noted that for implementation of this dichalcogenide production process, commercially available sulfur products are generally provided in a powder form and can be employed as-provided. The solid titanium precursor is not required to be provided in powder form and can be provided as, e.g., a foil. But the use of Ti powder of relatively small size, e.g., an average particle size of less than about 45 µm, can be preferred due to its distinctly higher specific surface area, which can accelerate the reaction rate between Ti and $NH_4Cl$ in a powder mixture of the two.

It is further discovered herein that the hygroscopicity of $NH_4Cl$ can be detrimental to the successful growth of high quality $TiS_2$. $NH_4Cl$ powder can absorb $H_2O$ rapidly at room temperature, and then at elevated reaction temperatures, the hydrated $NH_4Cl$ can release $H_2O$ vapor and hydrolyze the active $TiCl_x$ species in the reaction Expressions (7) and (9) above. The $TiO_2$ species resulting from this hydrolysis can be no longer sulfurized into $TiS_2$, due to the excellent thermodynamic stability of $TiO_2$. As a result, it can be preferred to dehydrate the $NH_4Cl$ powder prior to introduction of the powder into the heated reaction environment. If the $NH_4Cl$ powder is mixed with Ti powder, then the two-powder mixture can be together subjected to dehydration processing.

Figure 5:
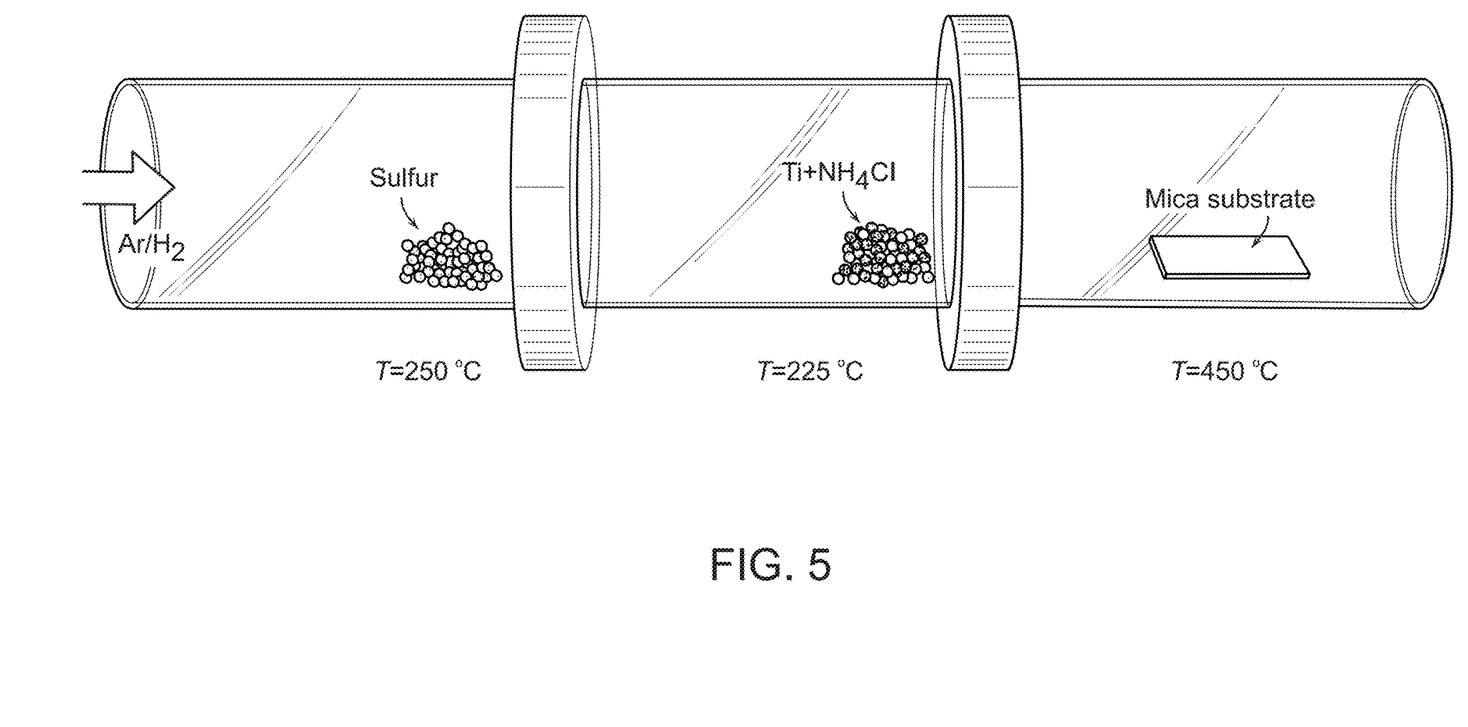
FIG. 5 is a schematic view of a heated reaction environment for conducting the reactions of FIG. 3 to produce the 1T-TsS$_2$ of FIGS. 4A-4B.

FIG. 5 is a schematic view of an example arrangement for a heated reaction environment that enables the CVD dichalcogenide production of reaction Expressions (6)-(9). A furnace tube is partitioned into three separate temperature zones to provide site-specific reaction temperatures. As shown in FIG. 5, in a first temperature zone, held at a temperature of between about 250° C.-300° C., e.g., 250° C., there are provided sulfur particles for evaporation into gaseous sulfur. In a second temperature zone, held at a temperature of between about 220-225° C., e.g., 225° C., there are provided titanium particles and ammonium chloride particles. At a third temperature zone, downstream of the first two temperature zones, and held at a temperature of about 450° C., there is provided one or more substrates, such as a mica substrate, on which is to be deposited the $TiS_2$ reaction product.

It is to be recognized that the thermal control indicated for the three-zone configuration of FIG. 5 can be implemented in any suitable fashion. Given that there is a gradient in temperature at the boundary of each temperature zone, the solid powders can be disposed at a site along the temperature gradient that achieves a particular selected temperature. For example, with a temperature of 220° C. set for the middle zone and a temperature of 450° C. set for the third zone, the temperature at the interface of the two zones is about 300° C., which is the temperature at which $NH_4Cl$ decomposes. Therefore, the powder mixture of $NH_4Cl$/Ti can be sited at the interface between the middle zone and third zone, to maximize $TiS_2$ deposition on the substrate. If the middle zone temperature is instead itself set at 300° C., then some reaction of the gaseous precursors could occur in this zone rather than near to the substrate, and would reduce the amount of material deposited on the substrate.

A single-zone furnace can be employed with the distance of each solid precursor from the heating center of the furnace selected to impose a selected temperature at the site of each solid precursor. For any thermal configuration, a selected carrier gas or gases, such as $Ar/H_2$, are introduced in the reaction environment to transport the gaseous species toward the site of the substrate within the reaction environment, for deposition of solid reaction product on the substrate.

TiS$_2$ production is one example of the general CVD methodology provided herein, which can be extended to any elemental solid that is reactive with a hydrogen halide. Other chalcogenides, such as VS$_2$, SnS$_2$, ZrS$_2$, TaS$_2$, SnSe, and TiS$_3$ can similarly be produced with the method of reaction Expressions (1)-(2) and (4)-(5), with NH$_4$Cl provided as the assistive reagent for producing gaseous elemental halide-based precursors. The temperature of the third, downstream growth zone of the reaction environment is adjusted to enforce reaction between the gaseous precursors of each process. For example, in the production of SnSe, the temperature of the third, downstream growth zone is preferably greater than about 600° C.; in the production of TiS$_3$, the temperature of the third, downstream growth zone is preferably less than about 400° C. All that is required is adjustment of the zone temperatures to ensure decomposition, evaporation, and reaction for the selected precursors in a given process.

Thus, the CVD methodology provided herein enables direct access, from solid starting materials, to a wide range of chalcogenide material layers of high crystallinity, provides superior growth morphology control over domain size, shape, and thickness, and provides superior process repeatability, all with the convenience of conventional CVD environments. The in situ generation of volatile reagents and CVD precursors overcomes the limitations inherent to the materials addressed by the methodology without causing degradation in the resulting crystal quality. As a result, the CVD methodology provided herein provides a superior paradigm for the production of 2D atomic crystals and their heterostructures.

Experimental Example

A three-temperature-zone furnace equipped with a 1-inch-diameter quartz tube was configured for CVD production of TiS$_2$ films by way of reaction Expressions (6)-(9). Two heat-insulating plates were placed at the junctions of neighboring temperature zones to suppress heat convection so that the set temperature in each zone could be kept stable during the process. Sulfur powder (~2 g, ≥99.5% purity, Sigma Aldrich) was disposed in an alumina boat in the upstream zone of the furnace at a temperature of 250° C. A combination of Ti powder (99.98% trace metal basis, Sigma Aldrich) and NH$_4$Cl powder (99.999%, metal basis, Alfa Aesar) (total ~100 mg, mass ratio 1:5) were placed in the midstream zone at a temperature of 225° C. The distance between the sulfur powder and the Ti/NH$_4$Cl powders was in the range of 25-30 cm. Either a mica substrate or a silicon dioxide-coated silicon substrate was positioned within the CVD tube in the most downstream zone, and held at a temperature of about 450° C. for several process runs, and held at 600° C. for several process runs. Several growth processes were conducted for each type of substrate.

Prior to introduction of the Ti and NH$_4$Cl powder mixture in the quartz tube, there was conducted a dehydration pretreatment on the Ti/NH$_4$Cl powder mixture. The powder mixture of ~100 mg, mass ratio 1:5, was dispersed in acetone and shaken for 5 min. This resulted in the hydration water of the NH$_4$Cl being effectively extracted by the acetone because of their miscibility. After the powder mixture settled down in the acetone liquid, the upper supernate was discarded, and the mixture was quickly loaded into the quartz tube before the powder mixture dried. Any trace acetone remaining on the powder mixture quickly evaporated completely, thus having no influence on the CVD reaction process.

Prior to commencement of the CVD process, the quartz tube was purged with 1000 sccm Ar/H$_2$ (volume ratio of 95:5) gas flow for 3 min, to eliminate any oxygen residues inside the tube. Then, during a thermal ramping period of t<20 min, based on a ramp rate in the range of 20-30° C./min, the Ar/H$_2$ carrier gas flow rate was kept at a low flow rate, of about 50 sccm, to prevent any transport and deposition of Ti-containing materials on the substrate. When the growth temperature reached the desired reaction temperature at the substrate downstream zone, the carrier gas flow rate was changed to a high flow rate, of about 350 sccm, in order to effectively transport the gaseous precursors produced in the upstream and midstream zones to the vicinity of the substrate for CVD growth of TiS$_2$ thereon. The reaction processes were enabled for several durations during separate process runs, including durations of 5 min, 7 min and 10 min, after which the furnace was cooled down naturally under an Ar/H$_2$ gas flow of 150 sccm.

Optical microscope (OM) images of as-synthesized TiS$_2$ on mica substrates displayed triangular-shaped TiS$_2$ nanosheets grown on the whole substrate surface. Characterization was implemented using optical microscopy (Axio Imager, Carl Zeiss), Raman (Witec CRM 200 Confocal Raman Microscopy), AFM (Dimension 3100, Veeco Instruments Inc.) and XPS measurement. The excitation wavelength for the Raman measurement was 532.5 nm. XPS measurements were carried out using PHI Versaprobe II with monochromic Al Kα monochromated (1486.6 eV) at a pass energy of 23.5 eV and 187.85 eV for high resolution and survey spectra, respectively. The highest peak in the C is spectra was shifted to 284.8 eV for charge correction. The CARL ZEISS: MERLIN™ scanning electron microscope was used to identify the specimen on the SiO$_2$/Si surface while operated at a voltage of 20 kV. ADF-STEM images were taken with a FEI TITAN operated at 120 kV. The beam convergence angle was 25 mrad, with a probe current of ~10 pA.

The morphologies of the as-grown TiS$_2$ nanosheets were found to strongly depend on the growth substrate used during a given CVD process run. Half-hexagonal nanosheets tended to grow vertically on SiO$_2$-coated Si substrates, while triangular or truncated triangular flakes evolved on mica substrates, demonstrating an in-plane growth mode. It is recognized herein that mica, having a high-energy ionic surface, can induce adherent TiS$_2$ growth. In contrast to the sparse distribution of individual flakes on the SiO$_2$-coated Si substrates, TiS$_2$ growth on mica substrates was found to evolve into large-area continuous films up to the centimeter scale with a thickness of ~0.6 nm, which is a monolayer. In both cases, the obtained TiS$_2$ nanosheets exhibited ultraflat surfaces and good foldability/flexibility. This demonstrates that the CVD technique provided herein can be applied for the synthesis of high-quality TiS$_2$ molecular layers, or monolayers.

The morphology of TiS$_2$ nanosheets grown on SiO$_2$/Si substrates also demonstrated high dependence on the growth temperature. With the growth temperature decreased to 450° C., the thickness of TiS$_2$ nanosheets was significantly reduced, together with the shape evolution from hexagons to half-hexagons. In general, high temperature growth, at a temperature of greater than about 600° C., yielded TiS$_2$ flakes of tens of nanometers in thickness, while growth at a relatively low temperature, e.g., at 450° C., produced much thinner TiS$_2$ flakes and films. At an elevated growth temperature of 600° C., TiS$_2$ nanosheets grown on mica exhibited regular hexagonal shapes with smaller domain sizes, in comparison to those grown under 450° C. Hence, to achieve 2D layered growth, e.g., for monolayer molecular film thickness, a downstream temperature in the range of 450-500° C. can be preferred.

Inspection of the $TiS_2$ films mica substrates determined that the surface morphologies of $TiS_2$ can be finely controlled by adjusting the growth time, $t_{grow}$. When $t_{grow}$ was less than 5 min, there were no $TiS_2$ triangles formed on the mica substrate, indicating a dead time of >5 min for precursor gas transport and $TiS_2$ formation. When $t_{grow}$=7 min, discrete $TiS_2$ flakes with small sizes appeared on the mica substrate, suggesting the onset point for $TiS_2$ growth. Notably, the thicknesses of these individual flakes varied, suggesting an island growth behavior rather than a layer-by-layer growth behavior. When the growth time was increased to 10 min, large $TiS_2$ flakes with thicknesses of tens of nanometers formed on the mica substrate, stitched together by monolayer $TiS_2$ films in the surrounding regions. The deposited amount was further increased by either prolonging the growth time or elevating the evaporation temperature of the $Ti/NH_4Cl$ mixture. This demonstrates the controllability of the CVD process with the assistance of the ammonium halide evaporation promoter.

Under the conditions given above, it is thereby shown that a continuous $TiS_2$ film can be produced with a growth time of greater than about 10 min. This film is a result of the combination of numerous $TiS_2$ flakes that are coalesced together, contributing to a nonuniform thickness distribution across the extent of the film. The film can be as thin as monolayer form, which is a single S—Ti—S sandwich structure of about 0.58 nm in thickness.

The deposited material layers, such as $TiS_2$ nanosheets grown on mica substrates, can be facilely transferred onto arbitrary substrates with the aid of a polymer support, such as PMMA, on top and an appropriate substrate etchant, such as ammonium fluoride solution, as the mica etchant. Raman spectra collected on transferred samples show identical line shapes as that of as-grown $TiS_2$ on mica without any emergence of $TiO_2$ signals. This demonstrates that high crystal quality $TiS_2$ nanosheets are resistive to water hydrolysis to some extent, hence surviving the wet-chemistry transfer process. The transferability of $TiS_2$ grown on mica enables this semimetallic 2D material to be integrated with other layered materials to form functional van der Wags architectures, thus broadening the range of 2D materials.

A scanning electron microscope (SEM) image of a half-hexagonal $TiS_2$ nanosheet and a bright field (BF)-TEM image of a truncated triangular-shaped $TiS_2$ nanosheet indicated the flexibility of the $TiS_2$ samples at such thickness. A SAED pattern of a $TiS_2$ nanosheet transferred on a Cu grid exhibited characteristic hexagonally arranged spots, and a high-angle dark-field scanning TEM (HAADF-STEM) image of the $TiS_2$ nanosheets confirmed an atomic arrangement in good accordance with the 1T phase structure shown in FIGS. 4A-4B.

Figure 6A:
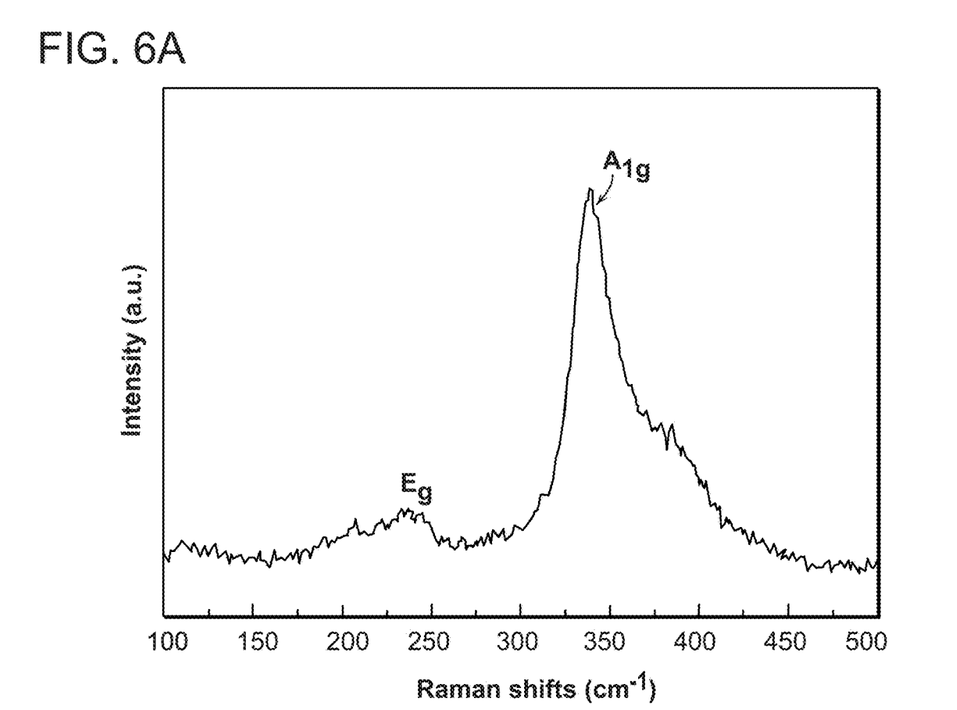
FIG. 6A is a plot of the measured Raman spectrum of an experimental TiS$_2$ nanosheet as-deposited on a silicon dioxide-coated silicon substrate by the CVD process of the flow diagram of FIG. 2.
Figure 6B:
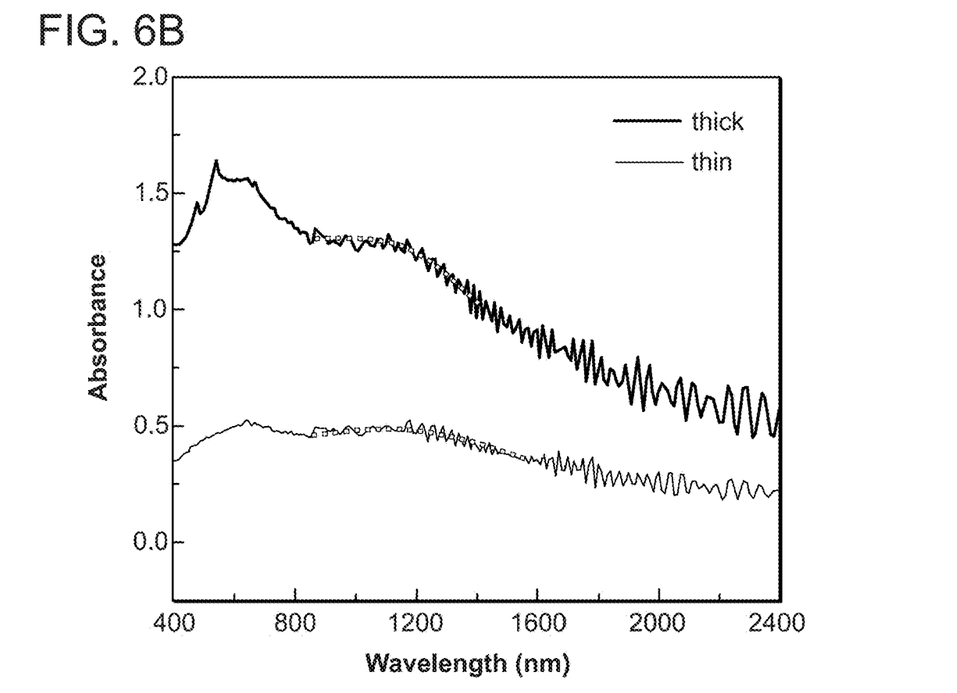
FIG. 6B is a plot of the measured absorption spectra of an experimental TiS$_2$ nanosheet as-deposited on a silicon dioxide-coated silicon substrate by the CVD process of the flow diagram of FIG. 2.

Raman spectroscopy was utilized to characterize the crystal quality and identify the composition of the $TiS_2$ nanosheets using a 532 nm excitation laser. FIG. 6A is a plot of the Raman spectrum of a $TiS_2$ nanosheet as-deposited on a silicon dioxide-coated silicon substrate. The synthesized $TiS_2$ nanosheet produced two Raman peaks, at ~230 $cm^{-1}$ land ~335 $cm^{-1}$, corresponding to the in-plane $E_g$ and out-of-plane $A_{1g}$ modes of the 1T $TiS_2$ phase structure. A Raman mapping image with the strongest peak (~335 $cm^{-1}$) of the half-hexagonal $TiS_2$ nanosheet on the $SiO_2$-coated Si substrate indicated significant uniformity across the layer. UV-Vis absorption spectra were also collected for $TiS_2$ sheets as-deposited on mica substrates with large portions of thick and thin flakes. FIG. 6B is a plot of the measured absorption spectra, showing the localized surface plasmon resonance (LSPR) peaks at ~1200 nm. This near-infrared LSPR absorption is a direct evidence for the semimetallic properties of the 2D $TiS_2$ films.

Figure 6C:
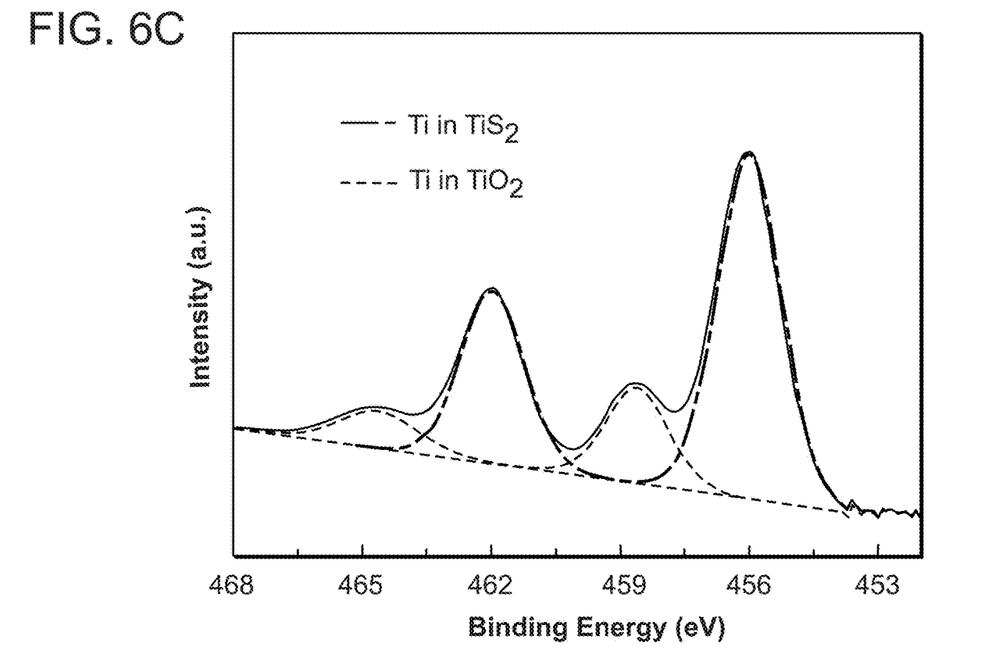
FIG. 6C is a plot of the measured XPS spectrum of Ti in an experimental TiS$_2$ nanosheet as-deposited on a silicon dioxide-coated silicon substrate by the CVD process of the flow diagram of FIG. 2, and a plot of the XPS spectrum that would be given for Ti in a TiO$_2$ film.
Figure 6D:
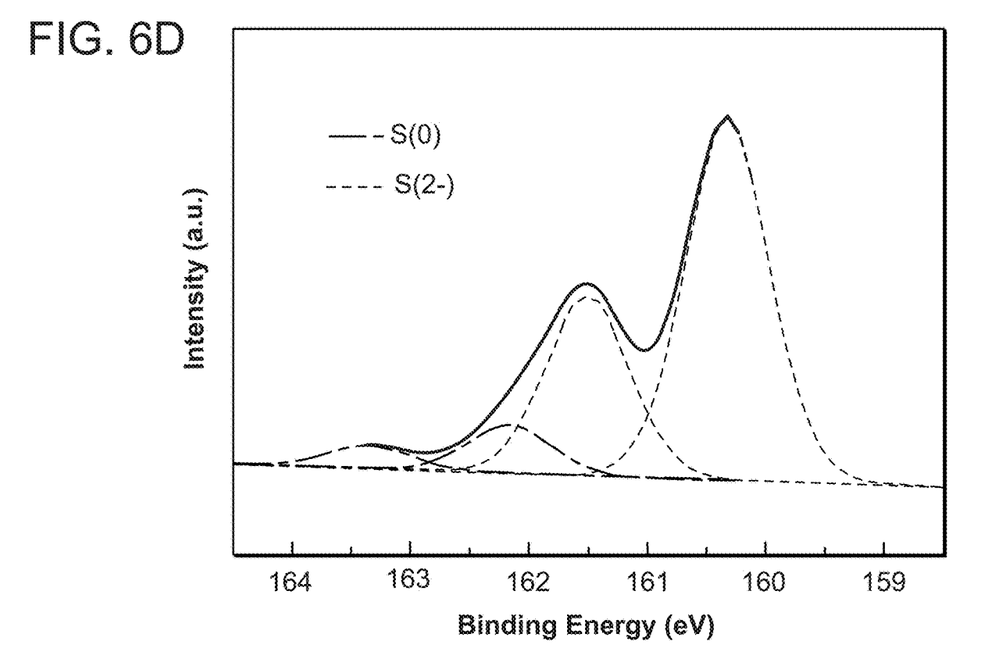
FIG. 6D is a plot of the measured XPS spectrum of sulfur in an experimental TiS$_2$ nanosheet as-deposited on a silicon dioxide-coated silicon substrate by the CVD process of the flow diagram of FIG. 2, for both elemental sulfur and S$^{2-}$ ions.

X-ray photoelectron spectroscopy (XPS) was employed to determine the elemental composition and bonding types of the $TiS_2$ films. FIG. 6C is a plot of the XPS spectrum of Ti in as-deposited $TiS_2$ films as well as a plot of the XPS spectrum that would be given for Ti in a $TiO_2$ film. The Ti 2p peaks at 456 eV (2p 3/2) and 462 eV (2p 1/2) can be assigned to Ti—S bonds, while the satellite peaks are indicative of Ti—O bonds. FIG. 6D is a plot of the XPS spectrum of sulfur in as-deposited $TiS_2$ films, revealing the presence of both elemental sulfur and $S^{2-}$ ions. Using the deconvoluted intensities, the $Ti^{4+}:S^{2-}$ atomic ratio after excluding those Ti atoms bonded with oxygen was revealed to be 1:1.9, in good agreement with the chemical formula of $TiS_2$.

Figure 7A:
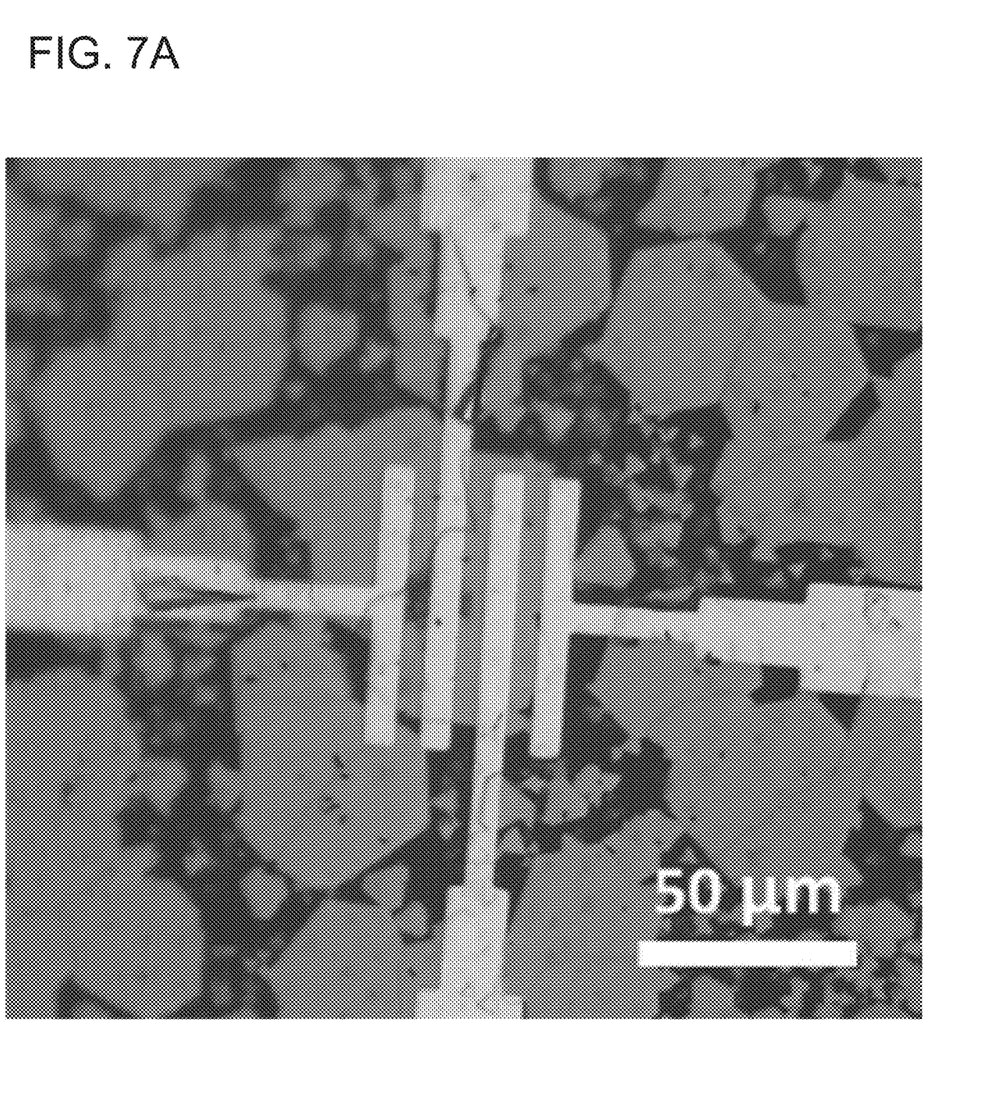
FIG. 7A is an optical microscope image of an experimental electrical device formed with a TiS$_2$ nanosheet by the CVD process of the flow diagram of FIG. 2.
Figure 7B:
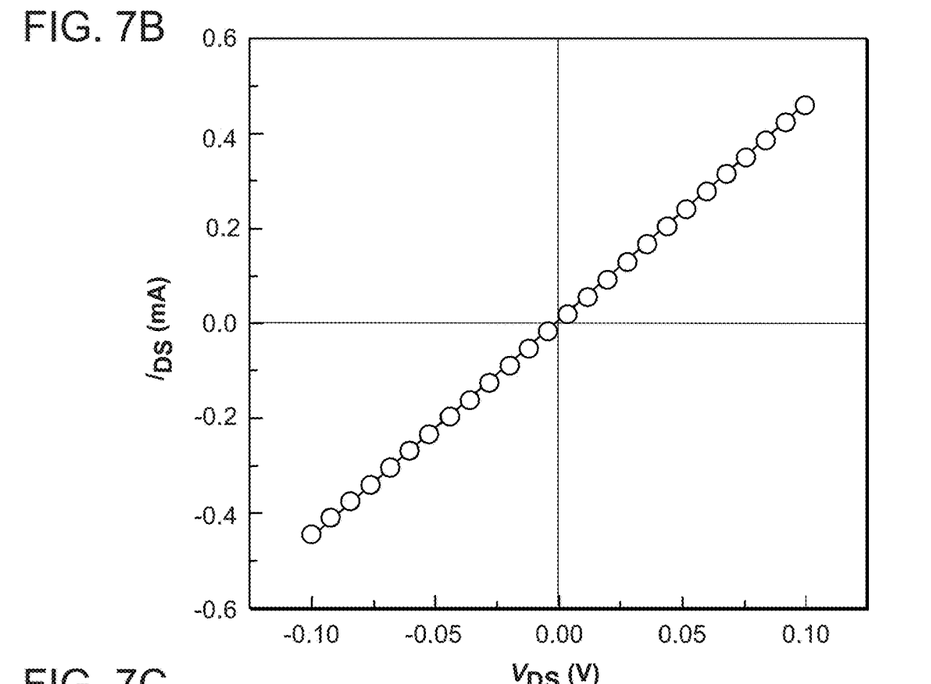
FIG. 7B is a plot of the measured I-V characteristic of the experimental device shown in FIG. 7A, here for a voltage sweep between –0.1 V and 0.1 V.
Figure 7C:
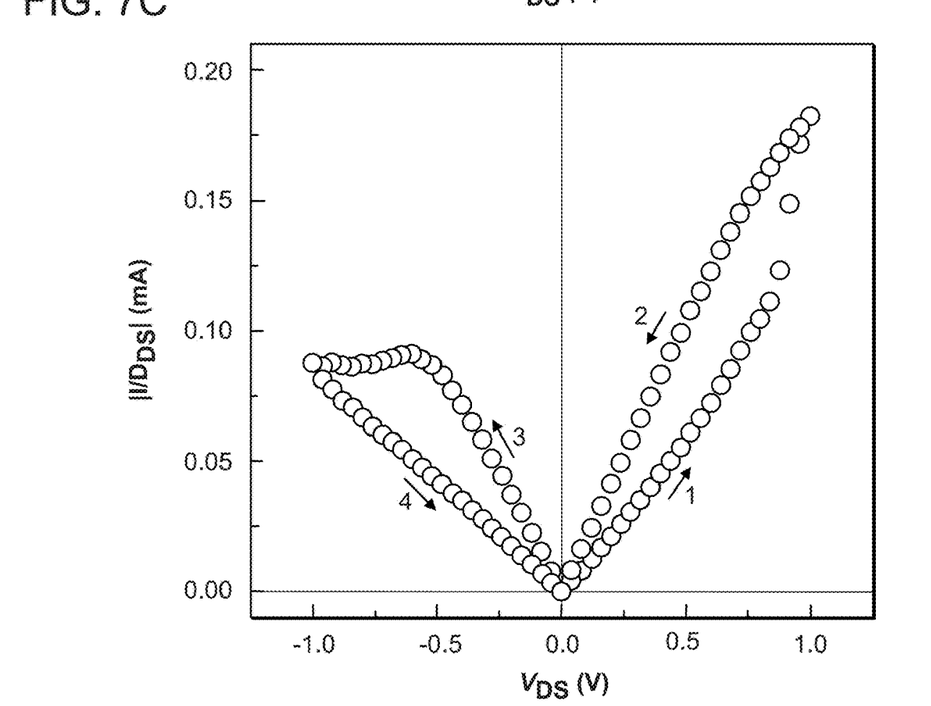
FIG. 7C is a plot of the measured I-V characteristic of the experimental device shown in FIG. 7A, here for a voltage sweep between –1.0V and 1.0V.

Electrical measurements were performed on as-grown $TiS_2$ films deposited on mica substrates. Ti/Au electrodes were formed directly on a $TiS_2$ layer using photolithography and e-beam metal deposition, to form a channel width, W, of 50 μm and a channel length, L, of 5 μm for adjacent electrodes. FIG. 7A is an OM image of a fabricated device. FIG. 7B is a plot of the measured I-V curve for the device of FIG. 7A. This measured I-V curve demonstrates an ohmic contact at the Ti—$TiS_2$ interface and a remarkable conductivity of ~4.5 mS for the device. The derived sheet resistance is 2.2 kΩ/sq using W=50 μm and L=5 μm. Multiple devices were measured, with their sheet resistances distributed in the range of 2-5 kΩ/sq. Using the characteristic flake thickness of ~50 nm, this can be translated into the bulk resistivity on the order of $10^{-4}$ Ωm, a typical value for a semimetallic material. FIG. 7C is a plot of the measured I-V curve for another $TiS_2$ device like that of FIG. 7A, across a wider voltage sweep. The numbered arrows indicate the sweep range from 1 to 4. This I-V relationship is characteristic of memristor-like behavior, in which the ohmic contacts persist both in high- and low-resistance states, and indicates the applicability of the material for a wide range of devices and systems.

The description and experimental example provided above demonstrate that the method herein enables ambient pressure CVD for the controllable synthesis of large-area, highly crystalline 2D chalcogenide films, including transition metal dichalcogenides and other chalcogenide materials. The CVD reaction methodology provides significant advantages over conventional preparation techniques including exfoliation and CVT. Because exquisite thickness control is achieved by the CVD methodology, there is enabled the CVD growth of versatile 2D atomic crystals that are as thin as one molecular layer, thereby addressing a wide range of advanced, planar microelectronic applications.

We claim:

1. A method for forming a chalcogenide film on a substrate comprising:

disposing an ammonium halide solid and an elemental solid together in a heated reaction environment at a common temperature;

forming hydrogen halide gas in the heated reaction environment by heating the ammonium halide solid at the common temperature, said common temperature causing ammonium halide solid to decompose into the hydrogen halide gas;

exposing the an elemental solid to the hydrogen halide gas in the a heated reaction environment at about ambient pressure and at the a temperature at which the hydrogen halide gas is formed, to promote the elemental solid to evolve into an elemental halide-based gas;

exposing the elemental halide-based gas to a chalcogen gas provided in the heated reaction environment, at a temperature at which the elemental halide-based gas is reactive with the chalcogen gas to produce a solid chalcogenide reaction product; and providing a substrate in the heated reaction environment for deposition thereon of a solid film of the solid chalcogenide reaction product that results from exposure of the elemental halide-based gas to the chalcogen gas in the heated reaction environment.

2. The method of claim 1 further comprising forming the chalcogen gas by heating a chalcogen solid in the heated reaction environment at a temperature that causes the chalcogen solid to evaporate into the chalcogen gas.

3. The method of claim 1 wherein the elemental solid exposure to a hydrogen halide gas while heating the elemental solid in a heated reaction environment is conducted at a temperature at which the hydrogen halide gas promotes the elemental solid to evolve into an elemental halide-based gas by the chemical reaction:

$$M(s) + nHX(g) \rightarrow MX_n(g) + n/2 H_2(g),$$

where M(s) is the elemental solid, X is a halogen, HX(g) is a hydrogen halide gas selected from HF, HCl, HBr, and HI, MX(g) is the elemental halide-based gas, and $H_2(g)$ is the hydrogen gas.

4. The method of claim 3 wherein the elemental halide-based gas exposure to a chalcogen gas provided in the heated reaction environment is conducted at a temperature at which the elemental halide-based gas is reactive with the chalcogen gas to produce a solid chalcogenide reaction product by the chemical reaction:

$$MX_n(g) + n/2 Y(g) + n/2 H_2(g) \rightarrow MY_{n/2}(s) + nHX(g),$$

where M is an element, X is a halogen selected from fluorine, chlorine, bromine, and iodine, $MX_n(g)$ is the elemental halide-based gas, Y is a chalcogen, Y(g) is the chalcogen gas, $H_2(g)$ is hydrogen gas, $MY_{n/2}(S)$ is the chalcogenide reaction product, and HX(g) is a hydrogen halide gas.

5. The method of claim 3 wherein the elemental solid, M(s), comprises an elemental solid selected from Si, Ge, Sn, Pb, As, Sb, Bi, Ti, Zr, Hf, V, Nb, Ta, Mn, Re, Fe, Co, and Ni.

6. The method of claim 3 wherein the elemental solid, M(s), comprises a metal.

7. The method of claim 1 wherein the hydrogen halide gas formation by heating an ammonium halide solid in the heated reaction environment is conducted at a temperature that causes the ammonium halide solid to decompose into the hydrogen halide gas by the chemical reaction:

$$NH_4X(s) \rightarrow NH_3(g) + HX(g),$$

where X is a halogen, $NH_4X(s)$ is an ammonium halide solid selected from $NH_4Cl$, $NH_4F$, $NH_4Br$, and $NH_4I$, $NH_3(g)$ is gaseous ammonia, and HX(g) is the hydrogen halide gas.

8. The method of claim 4 wherein the chalcogen gas, Y(g), comprises a chalcogen selected from S, Se, and Te.

9. The method of claim 1 wherein the elemental solid comprises Ti(s), the hydrogen halide gas comprises HCl(g), the elemental halide-based gas comprises $TiCl_x(g)$, the chalcogen gas comprises S(g), and the solid chalcogenide reaction product comprises $TiS_2(s)$.

10. The method of claim 1 wherein the elemental solid comprises a transition metal and wherein the solid chalcogenide reaction product comprises a transition metal dichalcogenide.

11. The method of claim 10 wherein the substrate comprises a substrate material selected from silicon and mica.

12. The method of claim 1 wherein the exposure of the elemental halide-based gas to a chalcogen gas in the heated reaction environment is conducted for a duration that produces on the substrate a solid chalcogenide reaction product film having a thickness of about one chalcogenide molecular layer.

13. The method of claim 1 further comprising a first step of flowing a gas through the heated reaction environment to purge oxygen from the heated reaction environment.

14. A method for forming a chalcogenide film on a substrate comprising: disposing an elemental solid powder and an ammonium halide solid powder in a heated reaction environment in a powder mixture of the elemental solid powder and the ammonium halide solid powder;

heating the powder mixture of the elemental solid powder and the ammonium halide solid powder in the heated reaction environment at a temperature that causes the ammonium halide solid to decompose into the hydrogen halide gas and promotes the elemental solid to evolve into an elemental halide-based gas;

exposing the elemental halide-based gas to a chalcogen gas provided in the heated reaction environment, at a temperature at which the elemental halide-based gas is reactive with the chalcogen gas to produce a solid chalcogenide reaction product; and providing a substrate in the heated reaction environment for deposition thereon of a solid film of the solid chalcogenide reaction product that results from exposure of the elemental halide-based gas to the chalcogen gas in the heated reaction environment.

15. The method of claim 14 further comprising dehydrating the powder mixture of the elemental solid powder and the ammonium halide solid powder before disposing the powder mixture of the elemental solid powder and the ammonium halide solid powder in the heated reaction environment.

16. A method for forming a chalcogenide film on a substrate comprising:

disposing in a heated reaction environment an ammonium halide solid, a chalcogen solid, an elemental solid, and a substrate, the ammonium halide solid and elemental solid at a common temperature;

forming hydrogen halide gas in the heated reaction environment by heating the ammonium halide solid in the heated reaction environment at the common temperature, said common temperature causing ammonium halide solid to decompose into the hydrogen halide gas;

exposing the elemental solid to the hydrogen halide gas in the heated reaction environment at about ambient pressure and at the a temperature at which the hydrogen halide gas is formed, to promote the elemental solid to evolve into an elemental halide-based gas;

forming a chalcogen gas in the heated reaction environment by heating the chalcogen solid in the heated reaction environment at a temperature that causes the chalcogen solid to evaporate into the chalcogen gas; and exposing the elemental halide-based gas to the chalcogen gas in the heated reaction environment at a temperature at which the elemental halide-based gas is reactive with the chalcogen gas to produce a solid chalcogenide reaction product that can deposit on the substrate in the heated reaction environment.

17. The method of claim 16 wherein the hydrogen halide gas comprises a hydrogen halide gas selected from HF, HCl, HBr, and HI.

18. The method of claim 16 wherein the elemental solid comprises an elemental solid selected from Si, Ge, Sn, Pb, As, Sb, Bi, Ti, Zr, Hf, V, Nb, Ta, Mn, Re, Fe, Co, and Ni.

19. The method of claim 16 wherein the chalcogen gas comprises a chalcogen gas selected from S, Se, and Te.

* * * * *